United States Patent
Leisenheimer

(10) Patent No.: US 11,774,523 B2
(45) Date of Patent: *Oct. 3, 2023

(54) TRANSISTOR DEVICES AND METHODS FOR PRODUCING TRANSISTOR DEVICES

(71) Applicant: Infineon Technologies AG, Neubiberg (DE)

(72) Inventor: Stephan Leisenheimer, Deisenhofen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 17/582,414

(22) Filed: Jan. 24, 2022

(65) Prior Publication Data

US 2022/0146603 A1    May 12, 2022

Related U.S. Application Data

(63) Continuation of application No. 16/370,106, filed on Mar. 29, 2019, now Pat. No. 11,237,226.

(30) Foreign Application Priority Data

Apr. 4, 2018 (DE) .............................. 102018107889
Feb. 7, 2019 (DE) .............................. 102019103030

(51) Int. Cl.
*G01R 33/06* (2006.01)
*G01R 33/07* (2006.01)
(Continued)

(52) U.S. Cl.
CPC .......... *G01R 33/07* (2013.01); *G01R 15/202* (2013.01); *G01R 33/072* (2013.01);
(Continued)

(58) Field of Classification Search
CPC .... G01R 33/07; G01R 33/077; G01R 15/202; G01R 33/072; G01R 33/075; G01R 33/09; G01R 33/0023; G01R 33/0094; G01R 33/0017; G01R 33/091; G01R 19/0092; H01L 2924/00014; H01L 2224/48091; H01L 25/0657; H01L 25/18; H01L 24/40; H01L 24/48; H01L 2924/30107; H01L 2224/06181; H01L 2224/40247;
(Continued)

(56) References Cited

U.S. PATENT DOCUMENTS

2005/0162160 A1    7/2005  Ausserlechner et al.
2008/0173961 A1*   7/2008  Naito ...................... H01L 24/14
                                                       257/E43.001
(Continued)

FOREIGN PATENT DOCUMENTS

DE    102011086034 A1    6/2012
DE    102017111410 A1    11/2017

*Primary Examiner* — Raul J Rios Russo
(74) *Attorney, Agent, or Firm* — Harrity & Harrity, LLP

(57) ABSTRACT

Transistor devices are provided. In some example implementations, a magnetic field sensor chip is fitted on a load electrode of a transistor chip. In other example implementations, two magnetic field sensors are arranged on a load electrode of a transistor chip in such a way that they measure different effective magnetic fields in the event of current flow through the transistor chip.

20 Claims, 12 Drawing Sheets

(51) Int. Cl.
  *H01L 25/065* (2023.01)
  *H01L 25/18* (2023.01)
  *G01R 15/20* (2006.01)
  *G01R 33/09* (2006.01)

(52) U.S. Cl.
  CPC ......... *G01R 33/075* (2013.01); *G01R 33/077* (2013.01); *G01R 33/09* (2013.01); *H01L 25/0657* (2013.01); *H01L 25/18* (2013.01); *H01L 2224/48091* (2013.01); *H01L 2924/00014* (2013.01)

(58) Field of Classification Search
  CPC . H01L 2924/13091; H01L 2224/08145; H01L 2224/48247; H01L 2225/06568; H01L 2225/0651; H01L 23/58; H01L 25/16
  USPC ........ 324/51, 55, 117, 127, 200, 207.2, 227, 324/228, 244, 251
  See application file for complete search history.

(56) References Cited

U.S. PATENT DOCUMENTS

| | | |
|---|---|---|
| 2012/0161751 A1 | 6/2012 | Akiyama et al. |
| 2013/0075724 A1* | 3/2013 | Hirler ................. H01L 27/0617 257/E29.089 |
| 2014/0176132 A1 | 6/2014 | Chen et al. |
| 2015/0061662 A1 | 3/2015 | Ausserlechner et al. |
| 2015/0076636 A1 | 3/2015 | Beer et al. |
| 2015/0185297 A1 | 7/2015 | Zimmer et al. |
| 2016/0377689 A1 | 12/2016 | Babulano et al. |
| 2016/0379966 A1* | 12/2016 | Chen ...................... G01R 33/07 257/48 |
| 2017/0343608 A1 | 11/2017 | Keser et al. |
| 2018/0234093 A1 | 8/2018 | Mauder et al. |
| 2018/0275214 A1* | 9/2018 | Haas .................. G01R 33/0017 |
| 2019/0310325 A1* | 10/2019 | Leisenheimer ....... G01R 33/077 |
| 2020/0025836 A1* | 1/2020 | Baumann ........... G01R 33/0017 |
| 2020/0103476 A1* | 4/2020 | Shin ........................ G09F 9/301 |
| 2022/0099709 A1* | 3/2022 | Barbut ................. G01R 15/205 |

* cited by examiner

TRANSISTOR DEVICES AND METHODS FOR PRODUCING TRANSISTOR DEVICES

RELATED APPLICATIONS

This application is a continuation of U.S. patent application Ser. No. 16/370,106, filed Mar. 29, 2019 (now U.S. Pat. No. 11,237,226), which claims priority under 35 U.S.C. § 119 to Germany (DE) Patent Application No. 102018107889.7 filed on Apr. 4, 2018, and to DE Patent Application No. 102019103030.7, filed on Feb. 7, 2019, the contents of each of which are incorporated by reference herein in their entirety.

TECHNICAL FIELD

The present application relates to transistor devices and methods for producing transistor devices.

BACKGROUND

In many applications, transistors are used as switches in order to selectively produce electrical connections. In particular, in some applications, transistors are used as power switches for switching high currents and/or voltages, for example in order to connect loads to a supply voltage in a switchable manner.

In many applications, for example for monitoring purposes and/or diagnosis purposes, it is desirable to measure a current that flows through such a transistor. The current is also referred to hereinafter as load current.

During the use of transistors, it is often necessary to regulate the load current, which can be done using a measurement of the load current.

A measurement of the load current may also be important, for example, in order to detect an overcurrent, i.e. to detect a current which goes beyond a predefined threshold value for which the transistor device and/or a device connected to the transistor device are/is specified. In the case of such an overcurrent, measures can then be employed, such as, for example, opening the transistor (i.e. disconnecting the electrical connection).

Various approaches for current measurement are conventionally used in transistor devices of this type. By way of example, in some cases, a shunt resistor is used for current measurements, that is to say that a voltage drop is measured across a resistor through which the current flows. In some approaches, a bond wire connected to the transistor is used as shunt resistor. Although this is relatively cost-effective, it is also relatively inaccurate. Alternatively, it is also possible to use an external shunt resistor, which enables a higher accuracy, but is comparatively expensive in its implementation and requires cooling on account of losses in the shunt resistor in some cases, in particular at high currents.

In other transistor devices, provision is made of a sensor transistor coupled to a load transistor in a current mirror configuration, the load transistor switching the load current mentioned above. However, the resultant current measurement can be inaccurate particularly in the case of low voltages.

Another approach involves using a voltage between terminals of the transistor as indirect current measurement, for example a measurement between a source terminal and a drain terminal of a field effect transistor.

A further possibility is current measurement by means of magnetoresistive elements, as is described in U.S. Patent Publication No. 2017/0343608 A1. In the case of this procedure, magnetoresistive elements can be provided in particular on a metal clip, which provides an electrical connection to a transistor.

SUMMARY

A transistor device as claimed in claim 1 or 12 and a method as claimed in claimed in claim 19 or 20 are provided. The dependent claims define further implementations.

In accordance with one example implementation, a transistor device is provided, comprising:
 a transistor chip having a first load electrode and a second load electrode, and
 a magnetic field sensor chip having at least one magnetic field sensor, wherein the magnetic field sensor chip is fitted on the second load electrode.

As a result of providing the magnetic field sensor chip on the second load electrode of the transistor chip, what can be achieved in some example implementations is that the magnetic field sensor is arranged near the transistor, which can result in a correspondingly high measurement signal.

The magnetic field sensor chip can comprise for example a driver circuit and/or a processing circuit for the at least one magnetic field sensor.

Additionally or alternatively, the magnetic field sensor chip can comprise a driver circuit, a diagnosis circuit and/or a protective circuit for a transistor of the transistor chip.

As a result of such an integration of further functions into the magnetic field sensor chip, a cost-effective implementation can be achieved in some implementations.

The driver circuit can be configured to generate a pulse-width-modulated control signal for a transistor of the transistor chip, and wherein the magnetic field sensor chip comprises a logic circuit configured to generate a signal indicating a current between the first load electrode and the second load electrode on the basis of a difference between a first magnetic field, which is measured by the at least one magnetic field sensor when the transistor is switched on by the pulse-width-modulated control signal ($V_{Gate}$), and a second magnetic field, which is measured by the magnetic field sensor when the transistor is switched off by the pulse-width-modulated control signal ($V_{Gate}$).

In this case, the logic circuit can be configured for providing a pulse-width-modulated signal for the driver circuit.

The magnetic field sensor can comprise a vertical Hall sensor, for example, but is not restricted thereto.

The at least one magnetic field sensor can comprise a first magnetic field sensor and a second magnetic field sensor, wherein the magnetic field sensor chip is arranged on the second electrode in such a way that the first magnetic field sensor and the second magnetic field sensor measure different magnetic fields in the event of current flow through the transistor chip.

As a result of such an arrangement of two magnetic field sensors, an influence of stray fields can be reduced by evaluating a difference in the signals of the magnetic field sensors, such that the resulting signal indicates the current through the transistor chip with suppressed stray field.

For this purpose, the first magnetic field sensor and the second magnetic field sensor can have identical sensitivity directions, and the first magnetic field sensor and the second magnetic field sensor can be arranged in such a way that an angle between the magnetic field caused by the current flow through the transistor device and the sensitivity direction at a location of the first magnetic field sensor is different than an angle between the magnetic field caused by the current flow through the transistor device and the sensitivity direction at a location of the second magnetic field sensor.

The transistor device can furthermore comprise an electrical connection to the second load electrode, wherein the magnetic field sensor chip is arranged in such a way that the first magnetic field sensor is arranged in an interspace between the electrical connection and the second electrode and the second magnetic field sensor is arranged outside the interspace.

As a result of such an arrangement of one of the magnetic field sensors in a region between an electrical connection and the transistor, in particular the transistor electrode, a difference signal between the first and second magnetic field sensors is particularly pronounced, which can increase a measurement accuracy in some example implementations.

The electrical connection can comprise a bond wire or a metal clip, in particular in bent form.

The transistor device can further comprise an evaluation circuit for forming a difference between an output signal of the first magnetic field sensor and an output signal of the second magnetic field sensor.

In accordance with another example implementation, a transistor device is provided, comprising:
  a transistor chip having a first load electrode and a second load electrode,
  a first magnetic field sensor arranged on the second load electrode, and
  a second magnetic field sensor arranged on the second load electrode, wherein the first magnetic field sensor and the second magnetic field sensor are arranged in such a way that they measure different magnetic fields in the event of a current flow through the transistor device.

As a result of such an arrangement of two magnetic field sensors, an influence of stray fields can be reduced by evaluating a difference in the signals of the magnetic field sensors.

For this purpose, the first magnetic field sensor and the second magnetic field sensor can have identical sensitivity directions, the first magnetic field sensor and the second magnetic field sensor can be arranged in such a way that an angle between the magnetic field caused by the current flow through the transistor device and the sensitivity direction at a location of the first magnetic field sensor is different than an angle between the magnetic field caused by the current flow through the transistor device and the sensitivity direction at a location of the second magnetic field sensor.

The transistor device can further comprise an electrical connection to the second electrode, wherein the magnetic field sensor chip is arranged in such a way that the first magnetic field sensor is arranged in an interspace between the electrical connection and the second electrode and the second magnetic field sensor is arranged outside the interspace.

As a result of such an arrangement of one of the magnetic field sensors in a region between an electrical connection and the transistor, in particular the transistor electrode, a difference signal between the first and second magnetic field sensors is particularly pronounced, which can increase a measurement accuracy in some example implementations.

The electrical connection can comprise a bond wire or a metal clip, in particular in bent form.

The transistor device can further comprise an evaluation circuit for forming a difference between an output signal of the first magnetic field sensor and an output signal of the second magnetic field sensor.

The first load electrode and the second load electrode can be arranged on opposite sides of the transistor chip.

In accordance with a further example implementation, a method for producing a transistor device is provided, comprising:
  providing a transistor chip having a first load electrode and a second load electrode, and
  fitting a magnetic field sensor chip having at least one magnetic field sensor on the second load electrode.

As a result of providing the magnetic field sensor chip on the second load electrode of the transistor chip, what can be achieved in some example implementations is that the magnetic field sensor is arranged near the transistor, which can result in a correspondingly high measurement signal.

The method can further comprise providing an evaluation circuit for forming a difference between a first magnetic field, which is measured during a pulse-width-modulated driving of a transistor of the transistor chip in a switched-on state of the transistor, and a second magnetic field, which is measured during the pulse-width-modulated driving in a switched-off state of the transistor, for generating a signal indicating a current between the first load electrode and the second load electrode with stray field compensation.

In accordance with a further example implementation, a method for producing a transistor device is provided, comprising:
  providing a transistor chip having a first load electrode and a second load electrode,
  providing a first magnetic field sensor at a first location on the second load electrode,
  providing a second magnetic field sensor at a second location on the second load electrode, wherein the first magnetic field sensor and the second magnetic field sensor are arranged on the second load electrode in such a way that they measure different magnetic fields in the event of a current flow through the transistor chip.

As a result of such an arrangement of two magnetic field sensors, an influence of stray fields can be reduced by evaluating a difference in the signals of the magnetic field sensors.

For this purpose, the first magnetic field sensor and the second magnetic field sensor can be arranged in such a way that the first magnetic field sensor and the second magnetic field sensor have identical sensitivity directions, and that an angle between the magnetic field caused by the current flow through the transistor device and the sensitivity direction at a location of the first magnetic field sensor is different than an angle between the magnetic field caused by the current flow through the transistor device and the sensitivity direction at a location of the second magnetic field sensor.

The method can further comprise providing an evaluation circuit for forming a difference between an output signal of the first magnetic field sensor and an output signal of the second magnetic field sensor for generating a signal indicating a current between the first load electrode and the second load electrode with stray field compensation.

The above methods can be configured for producing one or more of the transistor devices explained above. In other words, providing transistor chip and magnetic field sensors and/or fitting the magnetic field sensor chip can be carried out in such a way that one of the transistor devices explained above results.

The above summary should be understood merely as a brief overview of some example implementations and should not be interpreted as restrictive. In particular, other example implementations may have different features than the features explained above.

DETAILED DESCRIPTION

Figure 1:
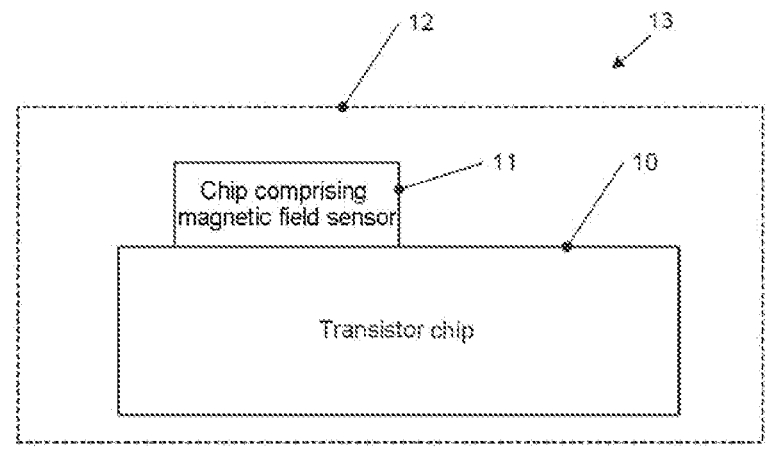
FIG. 1 is a schematic diagram of a transistor device in accordance with some example implementations.

Various example implementations are described below with reference to the accompanying drawings. These example implementations serve merely for illustration and should not be interpreted as restrictive. While some example implementations are described with a multiplicity of features (for example components, elements, details, processes, etc.) and the like, some of these features can also be omitted and/or replaced by alternative features in other example implementations. Furthermore, in addition to the features explicitly described below and shown in the drawings, further features can be provided, for example features of known transistor devices.

Unless noted otherwise, features of different example implementations can be combined with one another in order to form further example implementations. Variations and modifications described with regard to one or more of the example implementations can also be applied to other example implementations and will therefore not necessarily be described repeatedly.

In some example implementations, transistor devices are provided which comprise one or more transistors. Transistors generally comprise a control terminal, a first load terminal and a second load terminal. Depending on a signal fed to the control terminal, the transistor provides a low-impedance connection between the first and second load terminals (closed or switched-on state of the transistor), with the result that current can flow, or provides a decoupling between the load terminals (isolation of foreseen, possibly undesired stray currents), with the result that substantially no current can flow (open or switched-off state of the transistor). Some transistors can also be operated between these states, for example in a linear region.

In the case of a field effect transistor (FET), such as, for instance, a metal oxide semiconductor field effect transistor (MOSFET), the first and second load terminals correspond to the source and drain terminals and the control terminal corresponds to the gate terminal. In the case of an insulated gate bipolar transistor (IGBT), the first and second load terminals correspond in turn to the drain and source terminals, and the control terminal corresponds to the base terminal. In the case of a bipolar transistor (BJT: Bipolar Junction Transistor) the first and second load terminals correspond to a collector and emitter terminal, and the control terminal corresponds to the base terminal. Even if MOSFET transistors are used as an example for many of the example implementations described in detail below, other example implementations can be implemented using other types of transistor.

In some example implementations, Hall sensors, in particular vertical Hall sensors, are used for measuring currents in transistor devices. Hall sensors use the Hall effect to measure a magnetic field. In this case, generally a current is sent through the Hall sensor and the so-called Hall voltage is measured, which is dependent on a magnetic field. In some example implementations, the magnetic field is caused by a current to be measured. Thus, the current can then be deduced by measuring the magnetic field.

In the case of vertical Hall sensors, the structures of the Hall sensor are arranged in a substrate, for example in a silicon substrate, in such a way that the Hall sensor is sensitive to magnetic fields parallel to the substrate surface. Vertical Hall sensors of this type are known per se and can be fabricated using known techniques. In other example implementations, lateral Hall sensors can also be used, in which the Hall sensor is arranged in such a way that it is sensitive to magnetic fields perpendicular to the substrate surface.

Even if Hall sensors of this type, in particular vertical Hall sensors, are used as an example of a magnetic field sensor in many of the example implementations described below, it is also possible to use other types of magnetic field sensors, for example magnetoresistive sensors, generally referred to as xMR sensors. Magnetoresistive sensors use magnetoresistive effects that change an electrical resistance of a magnetoresistive sensor element depending on a magnetic field. Various magnetoresistive effects can be used for xMR sensors, for example an anisotropic magnetoresistance (AMR), a giant magnetoresistance (GMR), a colossal Magnetoresistance (CMR) or a tunneling Magnetoresistance (TMR).

The implementation of magnetoresistive elements is known to the person skilled in the art in the field of magnetoresistive sensor elements and will not be described thoroughly in the context of this disclosure.

In order to implement magnetoresistive elements of this type, generally a plurality of layers of ferromagnetic, antiferromagnetic and/or dielectric materials are deposited on a substrate, and one or more layers are magnetized in order to serve as reference layer. Magnetoresistive sensors are usually likewise sensitive to magnetic fields in a specific direction (which is dependent on the position of the layer plane and the direction of the magnetization in the layers) and are largely insensitive or at least less sensitive to magnetic fields in other directions, as is likewise known to the person skilled in the art.

For magnetic current sensors, the magnetic field generated by a current to be measured serves for indirectly measuring the current. Magnetoresistive elements can be arranged in a bridge configuration in order to measure a magnetic field, as is known to the person skilled in the art.

Another type of magnetic field sensors used in various example implementations is vortex sensors. For the function and construction of a vortex sensor, reference is made to U.S. Patent Publication No. 2015/0185297.

Accordingly, in the example implementations described in detail further below, instead of the described Hall sensors, in particular vertical Hall sensors, it is also possible to use other magnetic field sensors such as xMR sensors, lateral Hall sensors or vortex sensors. As explained above, magnetic field sensors are sensitive to magnetic fields in some directions (perpendicular to a sensor plane in the case of Hall sensors, parallel to a layer plane in the case of xMR sensors) and are at least largely insensitive to magnetic fields in other directions. The direction in which a magnetic field sensor is sensitive as described above is referred to as "sensitivity direction" in the context of this application.

Any designations with reference to the figures such as "at the top", "at the bottom", "top side", "underside", "right" and "left" are intended only for easier reference to different parts of the figures and do not define an actual position of the illustrated transistor devices in implementations since the latter can be implemented in arbitrary orientations.

Identical or mutually corresponding features bear the same reference signs in different figures and will not be described repeatedly.

FIG. 1 is a schematic illustration of a transistor device 13 in accordance with one example implementation. The transistor device in FIG. 1 comprises a transistor chip 10, i.e. a semiconductor chip on which at least one transistor is formed. The transistor can be in particular a power transistor designed for switching high currents (for example a number of amperes) and/or high voltages (for example more than 50 volts or more than 100 volts), but is not restricted thereto. The transistor chip can be a silicon-based chip, but other semiconductors are also possible.

A magnetic field sensor chip 11 comprising a magnetic field sensor is applied directly on the transistor chip 10. "Directly" means, in particular, that the transistor chip and the chip comprising the magnetic field sensor chip 11 do not have their own packages. In particular, the magnetic field sensor chip 11 can be applied on a load electrode of a load terminal (e.g. drain electrode) of the transistor chip 10. In this case, the magnetic field sensor chip 11 can have an insulation layer (for example composed of silicon dioxide or silicon nitride) on a side facing the load electrode, and/or it is possible to provide such an insulation layer between the transistor chip 10 and the magnetic field sensor chip 11 in some other way in order to avoid a short circuit between the magnetic field sensor chip 11 and the load electrode. The magnetic field sensor can be a magnetoresistive sensor, a vertical Hall sensor, a lateral Hall sensor, or a vortex sensor, as described above. Applying the magnetic field sensor chip 11 on the transistor chip 10 in this way is also referred to as chip-on-chip technology. The designation chip-on-chip technology is likewise customary for this.

In this way, in some example implementations, it is possible for the magnetic field sensor of the magnetic field sensor chip 11 to be arranged near the transistor chip 10, in particular near the load electrode, and thus for a magnetic field that is generated by a current flow through the transistor chip and is present at the location of the magnetic field sensor to be stronger than in the case of arrangements where the magnetic field sensor chip 11 is situated further from the transistor chip 10. In some example implementations, the transistor chip 10 and the magnetic field sensor chip 11 comprising the magnetic field sensor can then be arranged in a common package 12.

In some example implementations, the magnetic field sensor chip 11, as will be explained in greater detail later, can also comprise even further functions, for example a driver for the magnetic field sensor and/or functions for the transistor of the transistor chip 10. In some example implementations, the magnetic field sensor chip 11 can also contain more than one magnetic field sensor. Examples thereof are explained in detail further below.

As a result of the use of chip-on-chip technology, in which a chip comprising a magnetic field sensor is fitted on an electrode of a transistor chip, in some example implementations, a compact construction is possible and the magnetic field sensor is near the electrode and can thus measure a comparatively strong magnetic field in some example implementations.

Figure 2:
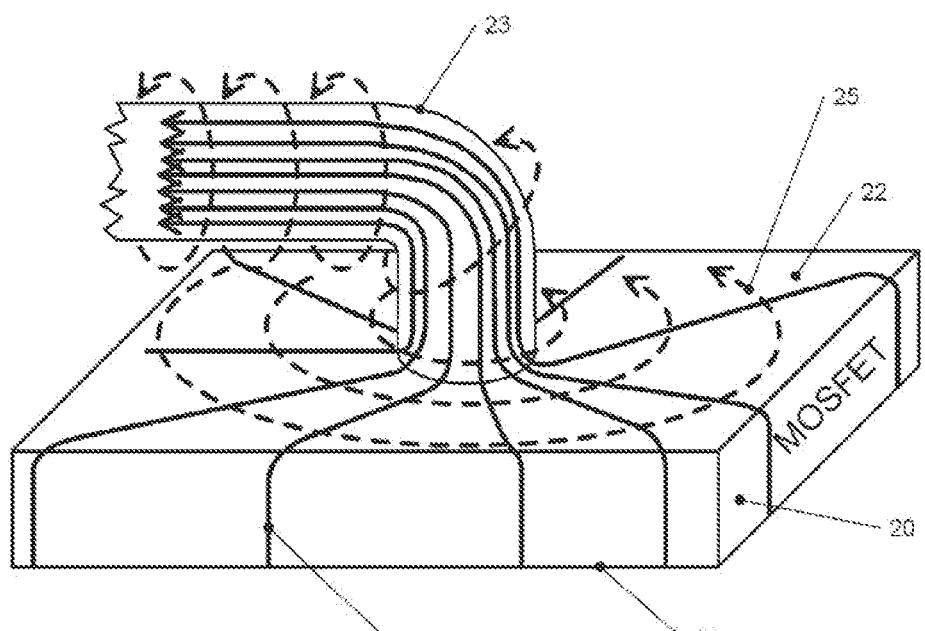
FIG. 2 is a diagram for illustrating currents and magnetic fields in a transistor device.

In order to explain current measurements by means of magnetic field sensors on transistor chips in greater detail, FIG. 2 shows one example of a transistor chip, on the basis of which various example implementations will then be explained in greater detail. In FIG. 2, a transistor chip 20 is illustrated as an example of a transistor chip. The transistor chip 20 has a first load electrode 21 of a first load terminal on a first side (the underside in FIG. 2, even though the orientation illustrated should not be interpreted as restrictive) and a second load electrode 22 of a second load terminal on an opposite second side (the top side in FIG. 2). In one example implementation, the transistor chip 20 is a MOSFET chip, the first load electrode 21 is a drain electrode, and the second load electrode 22 is a source electrode. Moreover, a control electrode (e.g. gate electrode; not illustrated in FIG. 2) can be provided for example on a part of the top side or at a side surface. In other example implementations, the first load electrode 21 can be a source electrode and the second load electrode 22 can be a drain electrode. In the following explanations, however, it is assumed as an example that 21 is a drain electrode and 22 a source electrode of the transistor chip 20 and the transistor chip 20 is a MOSFET chip. The transistor chip 20 can be an n-type MOSFET in the example in FIG. 2. In other example implementations, a p-type MOSFET or a different type of transistor can also be used.

In the example implementation in FIG. 2, a bond wire 23 serves for contacting the second load electrode 22, the bond wire having a bent (angular) shape in the example implementation in FIG. 2. In other example implementations, other courses are also possible. A transistor chip 20 of this type can be arranged for example in a package in such a way that the first load electrode contacts a leadframe of the package. Another possibility might involve securing the transistor chip on a printed circuit board for example in such a way that the first load electrode 21 contacts one or more electrical lines which can lead for example to a pin of a chip package or to further circuit parts. Via the bond wire 23, by way of example (for example via a leadframe), it is likewise possible to produce a connection to a pin of a chip package.

During operation, in a switched-on state of the MOSFET of the transistor chip 20, as indicated by solid arrows 24, current can flow through the transistor chip 20, i.e. from the first load electrode 21 through the transistor chip 20 and then via the second load electrode 22 toward the bond wire 23 and through the latter. With different polarity, the current flow can have the other direction.

The second electrode 22 is contacted by means of a bond wire 23. The first load electrode 21 can be contacted for example by the transistor chip 20 being secured by the load electrode 21 on a conductor track. In other example implementations, the load electrode 21 can likewise be contacted by a bond wire.

Solid lines 24 in FIG. 2 illustrate a possible current flow through the transistor chip 20 in a switched-on state from the first load electrode 21 through the transistor chip 20 to the second load electrode 22 and from there through the bond wire 23. Dashed lines 25 in FIG. 2 illustrate a magnetic field such as is generated by this current flow. The current flow indicated by the solid lines 24 and the magnetic field generated thereby and illustrated by the dashed lines 25 will be used for further illustration in the following example implementations.

The following figures show various example implementations based on the transistor chip 20 from FIG. 2. Elements that have already been explained with reference to FIG. 2 bear the same reference signs and will not be described repeatedly.

Figure 3A:
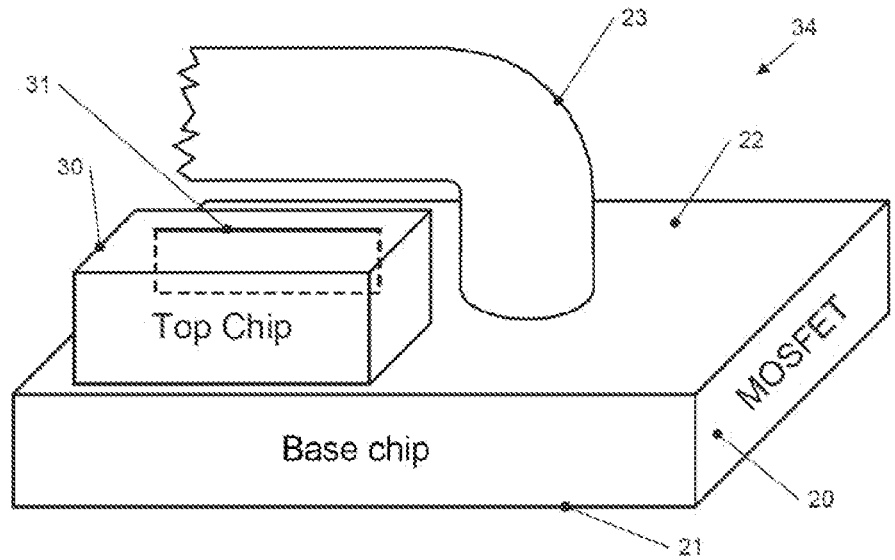
FIGS. 3A, 3B, 4, 5A, 5B, 6 and 7 show transistor devices in accordance with some example implementations.

FIG. 3A shows a transistor device 34 in accordance with some example implementations, which is based on the transistor chip 20 from FIG. 2. In the example implementation in FIG. 3A, the transistor chip 20 serves as a base chip, on which a further magnetic field sensor chip 30 as a so-called "top chip" is fitted directly, as already explained with reference to FIG. 1. In particular, the magnetic field sensor chip 30—if appropriate with an electrical insulation—is fitted directly on the second load electrode 22. The magnetic field sensor chip 30 contains a vertical Hall sensor 31 for measuring the magnetic field illustrated in FIG. 2 and caused by a current through the transistor chip 20. The magnetic field is associated directly with the current, such that the current can be deduced from the measured magnetic field. For this purpose, a calibration can be carried out, for example, in which known currents are sent through the transistor chip 20 or a current through the transistor chip 20 is measured by a further ammeter, for example an ammeter connected to the bond wire 23.

Figure 3B:
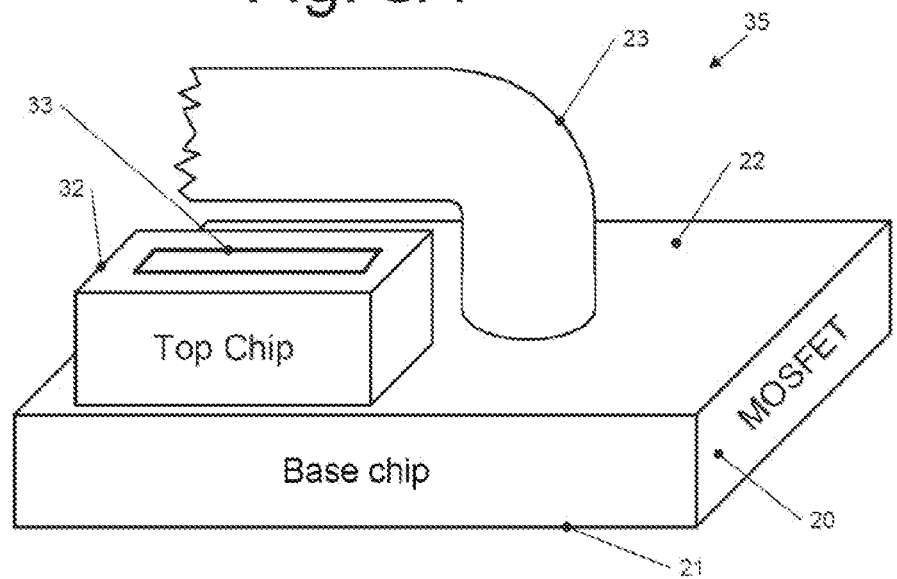

FIG. 3B shows a transistor device 35 as a modification of the transistor device 34 from FIG. 3A, in which a magnetic field sensor chip 32 comprising a lateral Hall sensor 33 is illustrated instead of the magnetic field sensor chip 30 comprising the vertical Hall sensor 31. In the orientation illustrated in FIG. 3B, the lateral Hall sensor is chiefly sensitive to magnetic fields generated by the current flow through the bond wire (in this respect, also see the magnetic field lines in FIG. 2). However, it is also possible to fit the magnetic field sensor chip 30 "on end" on the transistor chip 20, such that the lateral Hall sensor 33 has the same sensitivity direction as the vertical Hall sensor 31 from FIG. 3A. FIG. 3B is one example of how a different type of magnetic field sensor, in this case the lateral Hall sensor 33, can be used instead of a vertical Hall sensor such as the vertical Hall sensor in FIG. 3A.

Figure 4:
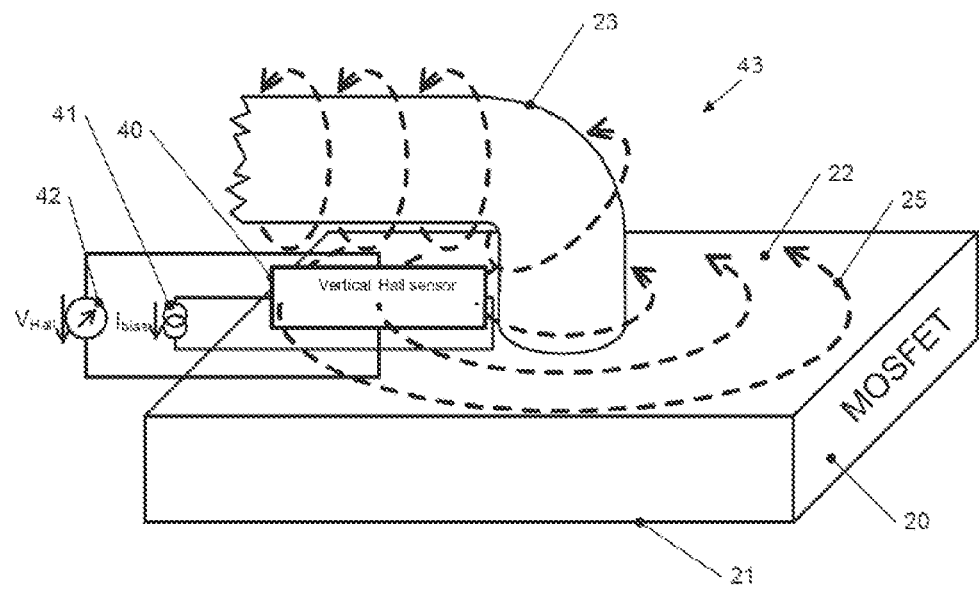

FIG. 4 shows an example of transistor device 43 with an arrangement of a vertical Hall sensor 40, such as the vertical Hall sensor 31 from FIG. 3A, for example, in a magnetic field. As illustrated in FIG. 4, the vertical Hall sensor 40, also referred to as Hall plate, can be arranged such that magnetic field lines impinge on the vertical Hall sensor 40 at an angle close to the perpendicular. Vertical Hall sensors, such as vertical Hall sensor 40 in FIG. 4, are sensitive to magnetic fields perpendicular to the plane of the Hall sensor, such that in the case of an arrangement as in FIG. 4, it is possible to measure approximately the entire magnetic field at the location of the Hall sensor. However, other arrangements are also possible, in which the magnetic field impinges on the vertical Hall sensor 40 more or less obliquely. The component of the magnetic field perpendicular to the Hall sensor is measured in this case.

In order to measure the magnetic field, a bias current $I_{Bias}$ is sent through the vertical Hall sensor 40 by means of a current source 41 and a resulting Hall voltage 42 VHall is measured. This corresponds to the customary measurement of magnetic fields by means of Hall sensors and therefore will not be explained in any greater detail here.

In some example implementations, the use of a magnetic field sensor, such as the vertical Hall sensor 40 illustrated, enables a current measurement that causes no losses in the current path (for example through the transistor chip 20 and the bond wire 23) because the measurement takes place outside the current path. Moreover, parasitic inductances in the current path do not affect the measurement itself, which can entail a relatively high accuracy of the current measurement in some example implementations. The measurement is also independent of the properties of the transistor such as the transistor chip 20. By way of example, in some example implementations, the measurement is independent of a switching characteristic curve of the transistor.

A current measurement on the basis of magnetic field sensors, as explained above, may be susceptible to stray fields, i.e. to magnetic fields generated by other components, for example other current lines. In some example implementations, the influence of such stray fields can be reduced by the use of two or more magnetic field sensors. Examples thereof will now be explained in greater detail with reference to FIGS. 5 to 8. In this case, arrangements comprising two vertical Hall sensors are used as an example in FIGS. 5 to 7. However, in other example implementations, arrangements comprising more than two magnetic field sensors or magnetic field sensors different than Hall sensors are also possible.

Figure 5A:
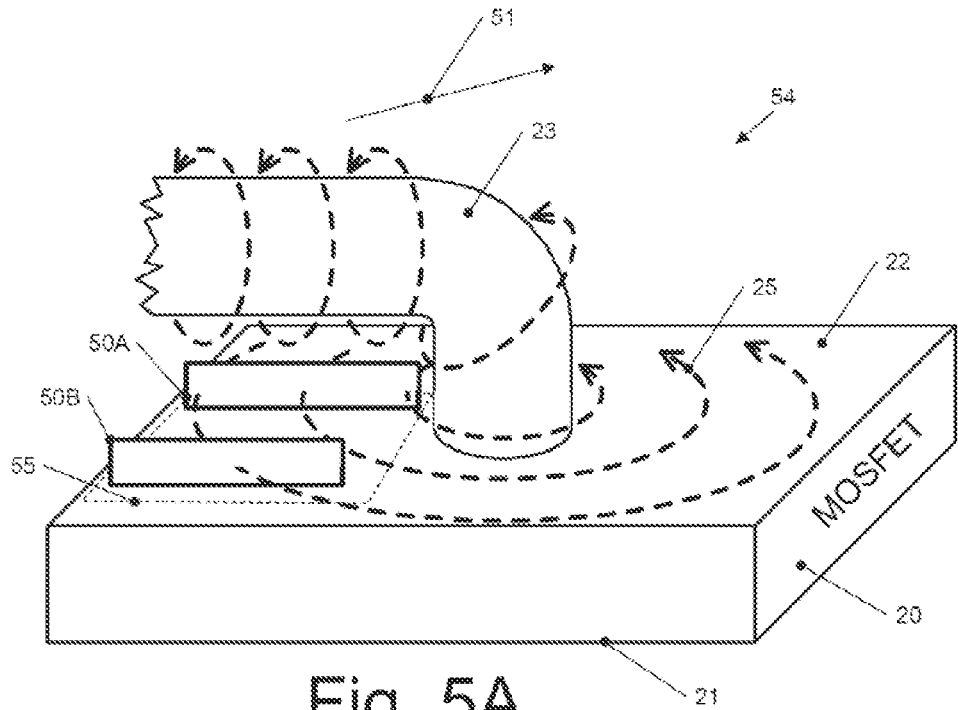

FIG. 5A shows a transistor device 54 in accordance with one example implementation, based once again on the transistor chip 20 with the bond wire 23. In the example implementation in FIG. 5A, two vertical Hall sensors 50A, 50B are arranged on the second load electrode 22. In this case, the magnetic field lines indicated by the dashed lines 25 impinge on the vertical Hall sensors 50A, 50B at various angles, such that the sensors measure different effective magnetic fields. In many cases, a stray field from a more distant source of interference, indicated as an example by an arrow 51 in FIG. 5A, can be assumed to be constant between the vertical Hall sensors 50A, 50B (far field approximation). If, as in FIG. 5A, the vertical Hall sensors 50A, 50B are then oriented identically (parallel in this case), that is to say have identical sensitivity directions, the vertical Hall sensors 50A, 50B measure approximately the same stray field. If a difference between the signals of the vertical Hall sensors 50A, 50B is then formed, as explained later, the influence of the stray field according to the arrow 51 is substantially cancelled, and the difference signal indicates the magnetic field caused by the current flow through the transistor chip.

Figure 5B:
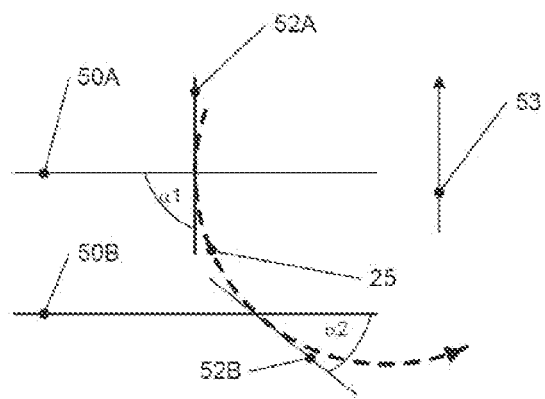

For further explanation of the disclosure above, FIG. 5B shows a schematic plan view of an excerpt 55 from the transistor device 54 from FIG. 5A. In particular, FIG. 5B illustrates the vertical Hall sensors 50A, 50B and, for elucidation purposes, only one dashed line 25 corresponding to a magnetic field line lying in the plane of the second load electrode 22 (cf. the magnetic field lines explained and illustrated in FIG. 2).

The vertical Hall sensors 50A and 50B are sensitive in a sensitivity direction perpendicular to their plane. The sensitivity direction is indicated by an arrow 53 in FIG. 5B. The magnetic field line 25 impinges on the first vertical Hall sensor 50A at an angle $\alpha 1$ and on the second vertical Hall sensor 50B at an angle $\alpha 2$. The angles here are measured in each case in relation to a tangent 52A and 52B, respectively, to the line 25 at a point of intersection of the magnetic field line 25 with the vertical Hall sensor 50A and 50B, respectively. The two angles $\alpha 1$ and $\alpha 2$ are increasingly identical as the distance between the vertical Hall sensors 50A and 50B decreases. As the distance increases, the angle difference reaches a maximum of 90°.

In the case of a magnetic flux density B caused by the current flow through the transistor, the first vertical Hall sensor 50A "sees" an effective magnetic field abs(B) sin$\alpha$1, and the second vertical Hall sensor 50B "sees" a magnetic field abs(B) sin$\alpha$2, wherein "abs" denotes the absolute value. The magnetic field thus "seen" corresponds to the component of the magnetic field B in the Sensitivity direction in accordance with the arrow 53. Since $\alpha$1 and $\alpha$2 are different, the magnetic fields respectively measured by the vertical Hall sensors 50A, 50B also differ, as explained above, thus resulting in a non-vanishing difference signal. By contrast, in many cases—with a far field approximation—the stray field 51 impinges on the first and second vertical Hall sensors 50A, 50B at approximately the same angle, such that no difference signal arises here, as explained. That is to say that with the use of the described difference signal as measurement signal of the two Hall sensors, this difference signal is insensitive to homogeneous stray fields such as the stray field 51.

In some example implementations, one of the vertical Hall sensors, the vertical Hall sensor 50A in the case of FIG. 5A, is arranged in an interspace between an electrical connection, such as the bond wire 23, and the electrode 22. As a result, the vertical Hall sensor 50A also "sees" the magnetic field around the bond wire 23 with relatively high strength, while the vertical Hall sensor 50B measures the magnetic field with less strength on account of the greater distance to the bond wire 23. This increases the difference between the signals of the vertical Hall sensors 50A, 50B.

It should be noted, however, that the effect described, i.e. the stray field suppression by difference formation, is possible not only for the specifically illustrated arrangement of the vertical Hall sensors 50A, 50B, but generally if the vertical Hall sensors 50A, 50B or other magnetic field sensors are arranged such that they measure the magnetic field arising as a result of the current flow with different strengths, for example because the magnetic field lines 25, as explained above, impinge on the vertical Hall sensors 50A, 50B at different angles; such that the measured magnetic field component perpendicular to a plane of the respective Hall sensor is different, and at the same time the sensitivity directions are identical, such that homogeneous stray fields are measured identically by both vertical Hall sensors 50A, 50B. The same correspondingly applies to other types of magnetic field sensors from among those explained in the introduction. Since the current flow through a transistor device and thus the profile of the resulting magnetic fields substantially result from the geometry of the transistor device (dimensioning of the electrodes, arrangement of electrical connections such as bond wires), it is possible, without any problems, for a person skilled in the art to find, for a given transistor device, a suitable arrangement of magnetic field sensors according to the above stipulations that the magnetic field ought to be measured with different strengths.

Figure 6:
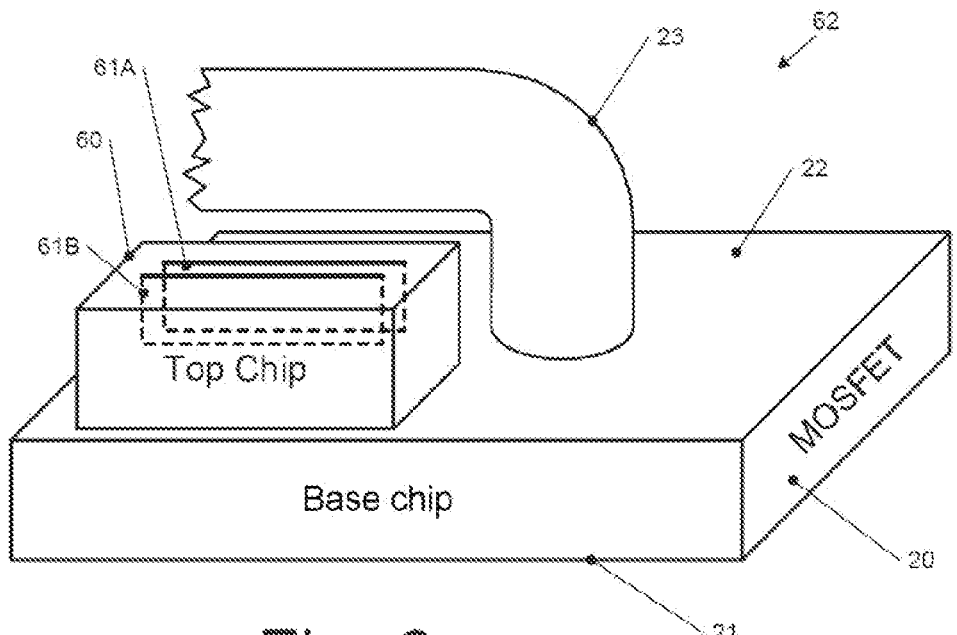

Two or more magnetic field sensors, such as the vertical Hall sensors 50A, 50B from FIG. 5A, can be integrated in a single chip. One example of a corresponding transistor device 62 is illustrated in FIG. 6. In the example implementation in FIG. 6, two vertical Hall sensors 61A, 61B are provided in a magnetic field sensor chip 60. The magnetic field sensor chip 60—in a manner similar to that as explained with reference to FIG. 3 for the magnetic field sensor chip 30—is fitted as "top chip" on the second load electrode 22. In some example implementations, the magnetic field sensor chip 60 can be positioned in this case in such a way that the vertical Hall sensor 61A is arranged in an interspace between the bond wire 23 and the second electrode 22, while the vertical Hall sensor 61B is arranged outside the interspace.

Figure 7:
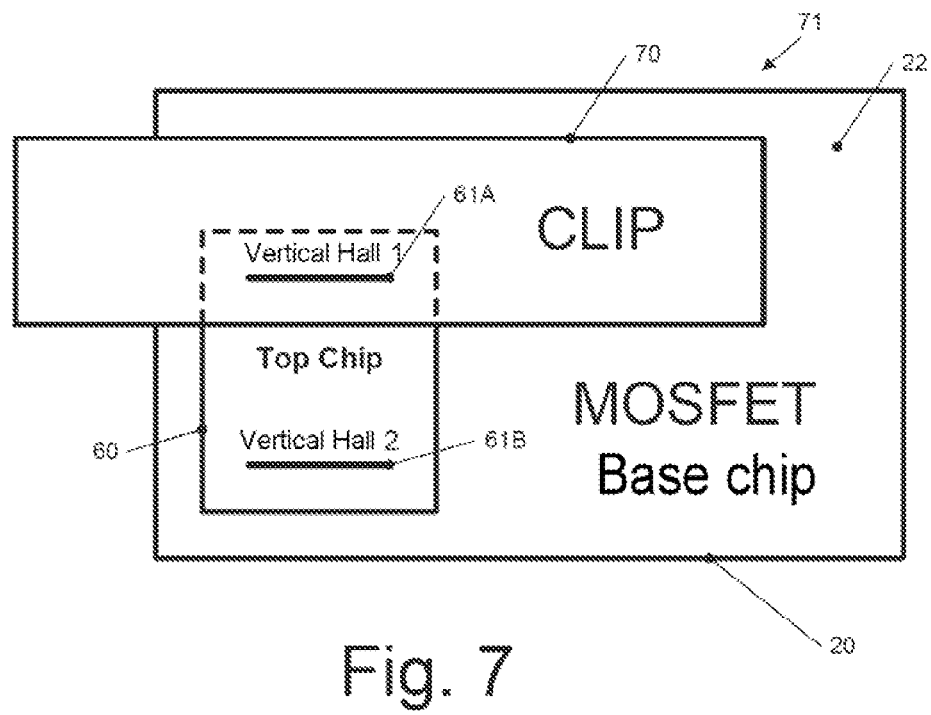

It should be noted that the arrangement of a magnetic field sensor in an interspace between an electrical connection and the electrode 22 is not restricted to the bond wire 23 as electrical connection. As a further example implementation, FIG. 7 shows a transistor device 71 comprising the transistor chip 20 having the second load electrode 22 in a plan view. Instead of the bond wire 23, a metal clip 70 is provided for conducting current. In this case, a metal clip is a more or less rigid piece of metal which can also have different shapes than the rectangular shape illustrated. The metal clip 70 provides an electrical connection to the second load electrode 22 e.g. by means of a mechanical stress of the metal clip 70, i.e. the metal clip 70 presses against the second load electrode 22. Consequently, bonding using ultrasound is not necessary. In the example implementation in FIG. 7, the magnetic field sensor chip 60, which has already been discussed with reference to FIG. 6, is arranged in such a way that the vertical Hall sensor 61A is arranged in an interspace between the metal clip 70 and the second load electrode 22, while the vertical Hall sensor 61B is arranged outside the interspace. Here, too, a homogeneous magnetic stray field can be suppressed by difference formation in respect of the signals of the vertical Hall sensors 61A, 61B.

Figure 8:
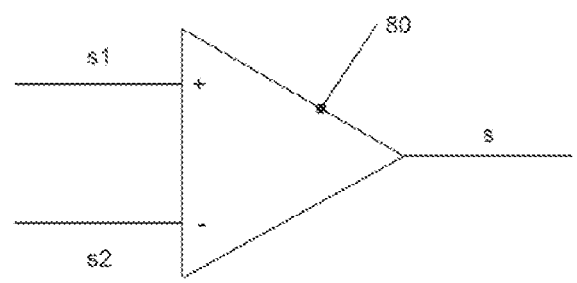
FIG. 8 shows a schematic example of an evaluation circuit in accordance with some example implementations.

One possibility for achieving a difference formation in respect of two sensor signals s1 and s2 of the vertical Hall sensors discussed in FIGS. 5A-7 is made possible by an interconnection as shown in FIG. 8. Here a first signal s1 of a first magnetic field sensor (for example of the vertical Hall sensor 50A from FIG. 5A or of the vertical Hall sensor 61A from FIGS. 6 and 7) is fed to a positive input of a differential amplifier 80, and a second signal s2 of a second magnetic field sensor (for example of the vertical Hall sensor 50B from FIG. 5A or of the vertical Hall sensor 61B from FIGS. 6 and 7) is fed to a negative input of the differential amplifier 80. A resulting difference signal s is then evaluated as described in order to draw conclusions about the current flow. A homogeneous stray field, such as the stray field 51 shown in FIG. 5A, changes both signals s1, s2 substantially in the same way, such that this change is almost cancelled out in the signal s. Such a sensor therefore has a robustness visa vis magnetic stray fields, which increases the accuracy of a current measurement.

FIGS. 3, 6 and 7 illustrated one or more magnetic field sensors, in this case Hall sensors, as integrated in a chip ("top chip"). Besides magnetic field sensors, further components can also be integrated in such a chip. Examples thereof will now be explained in greater detail with reference to FIGS. 9 to 12.

Figure 9:
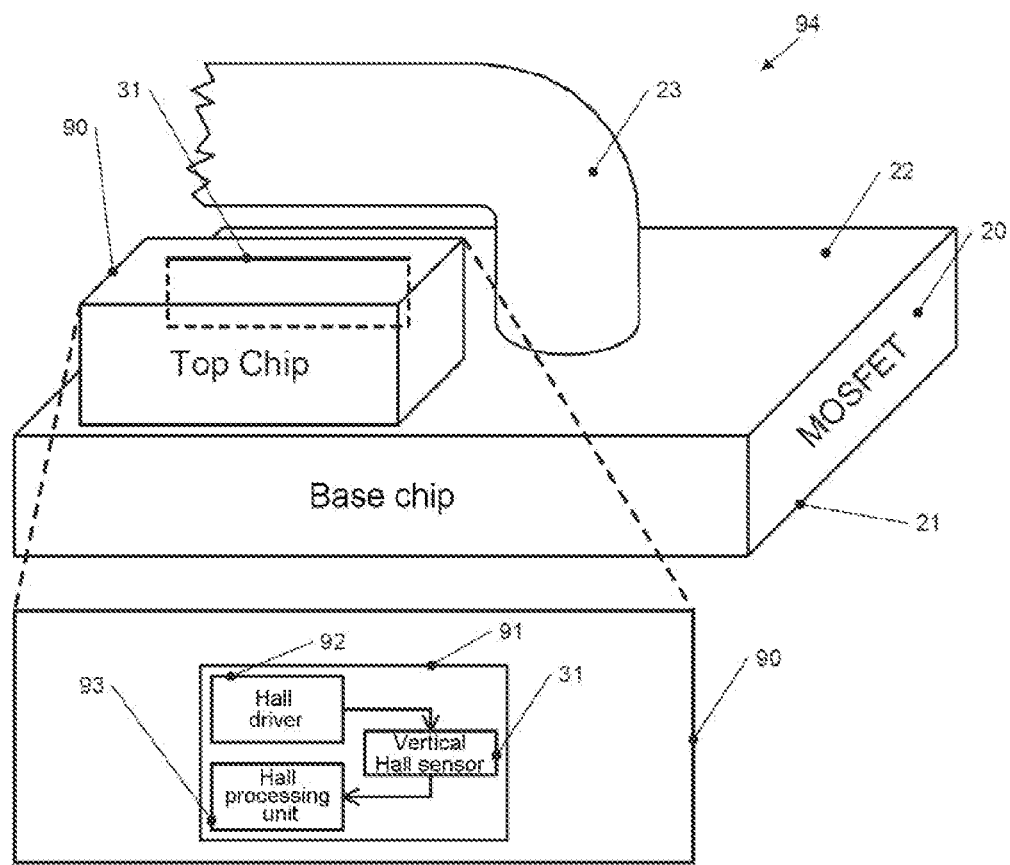
FIGS. 9-12 show transistor devices in accordance with various example implementations.

The example implementation in FIG. 9 shows a transistor device 94 and is based on the example implementation from FIG. 3A, and identical elements bear the same reference signs and will not be explained again. In particular, in the example implementation in FIG. 9, a magnetic field sensor chip 90 comprising the vertical Hall sensor 31 already explained is provided on the second load electrode 22.

In addition to the vertical Hall sensor 31, the magnetic field sensor chip 90 comprises further elements assigned to the vertical Hall sensor 31. In the example implementation in FIG. 9, the elements are in particular a Hall driver 92, which, as also explained with reference to FIG. 4, feeds a bias current to the vertical Hall sensor 31, and a Hall processing unit 93, which measures the Hall voltage and, if appropriate, processes it further. One example of such further processing can comprise filtering or encoding in order then to transmit the measured signal to a further unit for further evaluation. The Hall processing unit can also comprise an analog-to-digital converter, for example, in order to digitize the detected Hall voltage. The Hall driver 92, the vertical Hall sensor 31 and the Hall processing unit 93 are also referred to hereinafter in combination as Hall unit 91.

Figure 10:
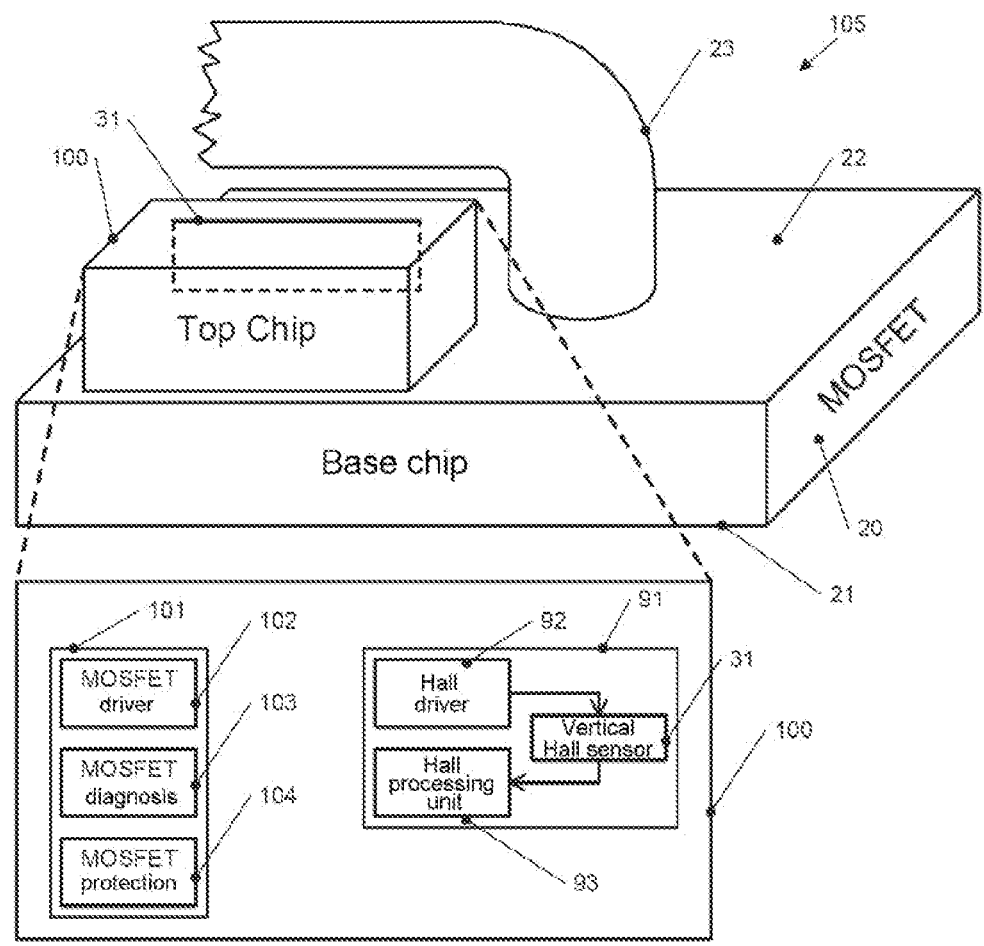

FIG. 10 shows a further example implementation of a transistor device 105, based once again on the example implementation from FIG. 3A. In this example implementation, a magnetic field sensor chip 100 comprising the vertical Hall sensor 31 is provided on the second electrode 22. As in the example implementation from FIG. 9, the magnetic field sensor chip 100 also contains the Hall unit 91 already described. Moreover, the magnetic field sensor chip 100 contains circuit parts that drive the transistor chip 20. In the example in FIG. 10, this comprises a MOSFET driver circuit 102, a MOSFET diagnosis circuit 103 and a MOSFET protective circuit 104. The circuits 102 to 104 are also referred to in combination as MOSFET unit 101.

The MOSFET driver circuit 102 supplies a signal, in particular a gate-source voltage, in order to open and to close the transistor chip 20. The MOSFET diagnosis circuit 103 monitors the functionality of the MOSFET. By way of example, it is possible to check whether a gate-source signal generated by the MOSFET driver circuit 102 has correct levels. The MOSFET protective circuit 104 can protect the transistor chip 20 against harmful events, such as overtemperature or overcurrent. By way of example, the protective circuit 104 can comprise a temperature sensor and, in the case of an overtemperature, i.e. a temperature above a predefined threshold value, open the transistor chip 20 in order to interrupt a current flow. A measurement of the vertical Hall sensor 31 can be used for overcurrent protection. If the current measurement by the vertical Hall sensor 31 indicates an overcurrent, i.e. a current above a predefined threshold value, the transistor chip 20 can likewise be opened.

The explained functionalities of the MOSFET unit 101 serve merely as an example and any circuits used in association with the driving, diagnosis and protection of MOSFETs or other transistors can be implemented here, for example, to provide functionalities known from so-called intelligent power switches.

Figure 11:
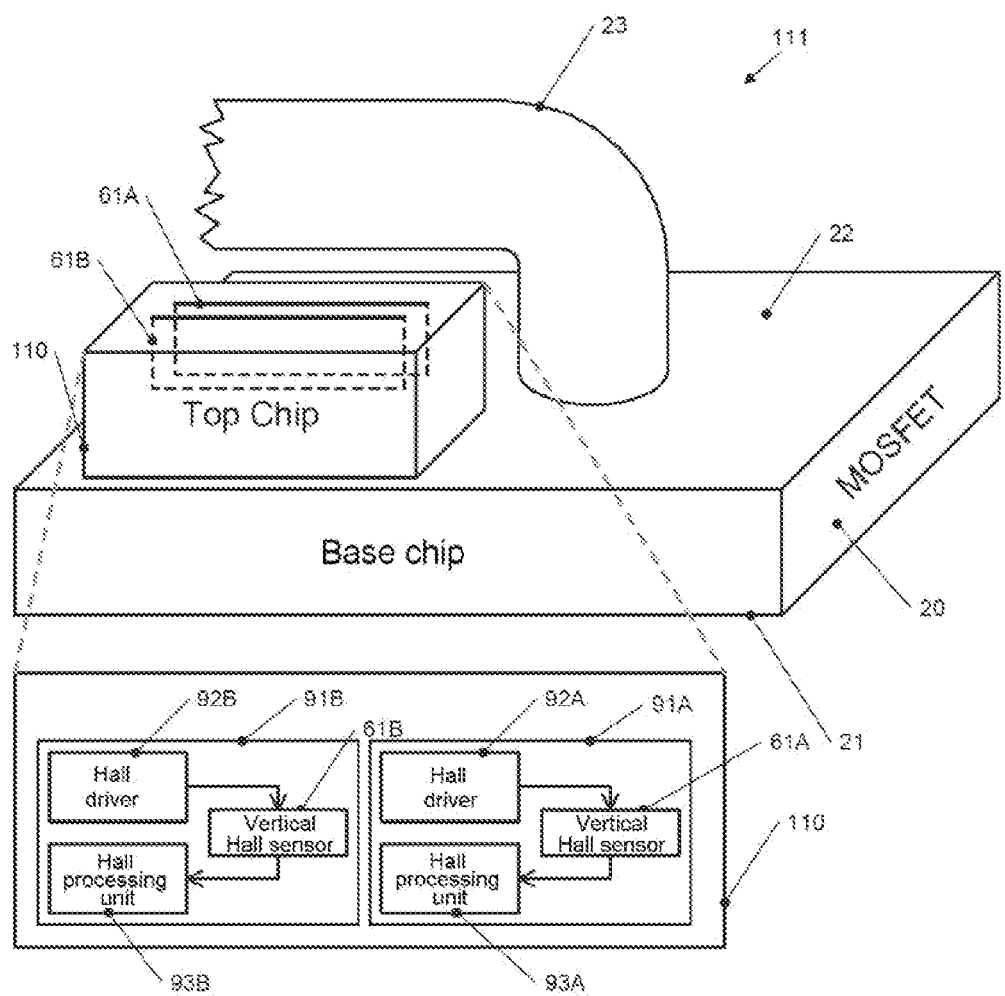

FIG. 11 shows a further example implementation of a transistor device 111, based on the example implementation from FIG. 6. In particular, in the example implementation in FIG. 11, a magnetic field sensor chip 110 fitted on the second load electrode 22 contains the first vertical Hall sensor 61A and the second vertical Hall sensor 61B. In addition to the vertical Hall sensors 61A, 61B, the magnetic field sensor chip 110 contains driver circuits and processing circuits for both Hall sensors 61A, 61B. In the example implementation in FIG. 11, the magnetic field sensor chip 110 contains in particular a first Hall unit 91A comprising the first vertical Hall sensor 61A and a second Hall unit 91B comprising the second vertical Hall sensor 61B. The first Hall unit 91A and the second Hall unit 91B are constructed in each case like the already described Hall unit 91 from FIGS. 9 and 10, wherein the Hall drivers 92A, 92B correspond to the Hall driver 92 of the Hall unit 91 and the Hall processing units 93A, 93B correspond to the Hall processing unit 93 of the Hall unit 91.

Figure 12:
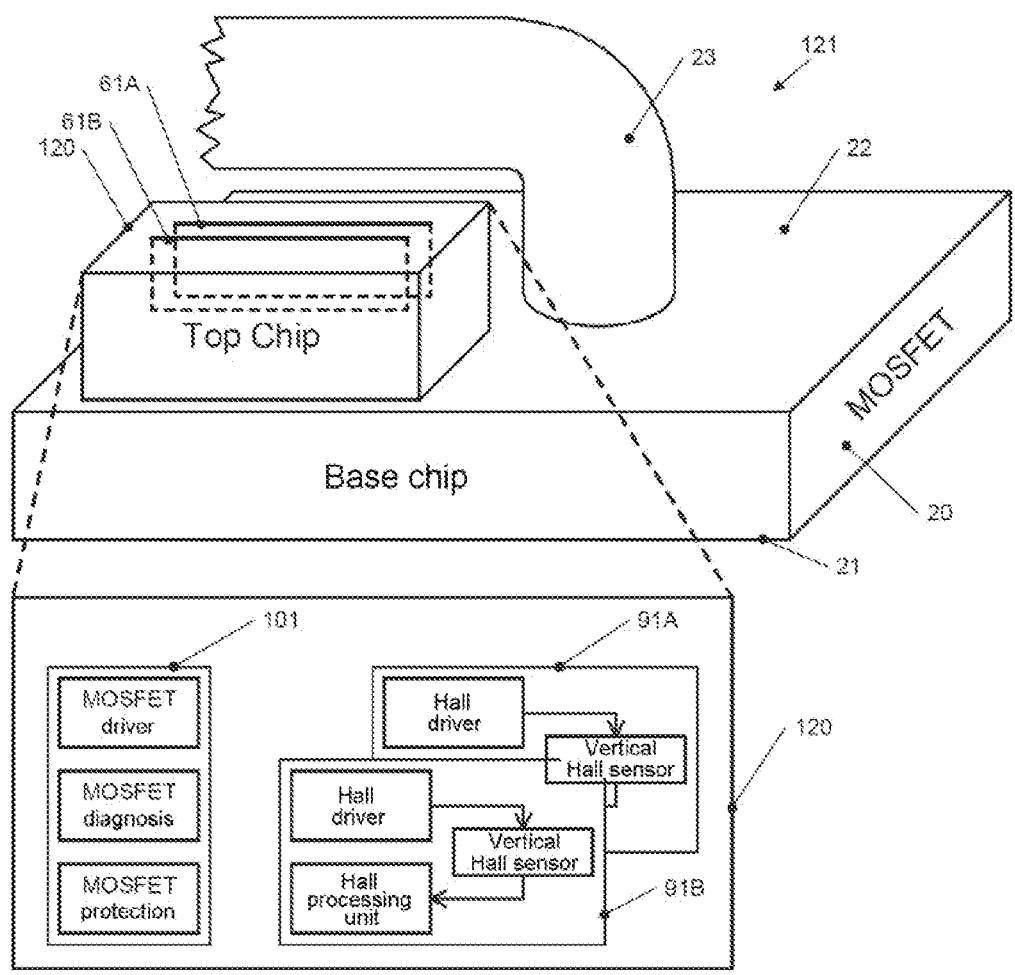

FIG. 12 shows a further example implementation of a transistor device 121, which is substantially a combination of the example implementation from FIGS. 10 and 11. Here a magnetic field sensor chip 120 fitted on the second load electrode 22 contains the vertical Hall sensors 61A, 61B. As explained with reference to FIG. 11, the chip contains the first Hall unit 91A comprises the vertical Hall sensor 61A and the second Hall unit 91B comprises the vertical Hall sensor 61B. In addition, as illustrated in FIG. 10, the MOSFET unit 101 is integrated in the magnetic field sensor chip 120. In this case, an overcurrent can be ascertained on the basis of a difference signal of the two Hall sensors. For this purpose, the magnetic field sensor chip 120 can contain a circuit as illustrated in FIG. 8 for forming the difference.

As evident from FIGS. 9 to 12, besides one or more magnetic field sensors, such as vertical Hall sensors, a chip can thus comprise various additional functionalities, both functionalities connected directly with the magnetic field sensors, such as driver and evaluation circuits, and other functionalities, for example driver circuits, protective circuits and diagnosis circuits for a transistor, such as the transistor chip 20.

Figure 13:
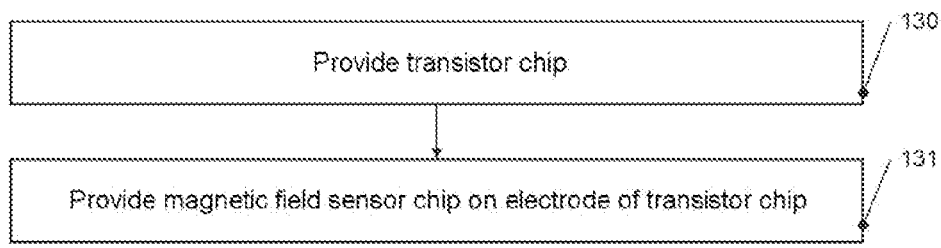
FIGS. 13 and 14 show flow diagrams for illustrating methods of various example implementations.
Figure 14:
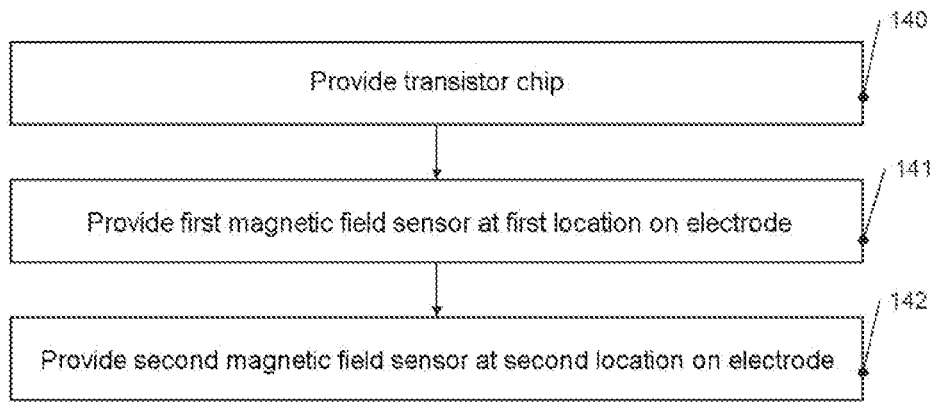

FIGS. 13 and 14 show flow diagrams for illustrating methods for producing transistor devices in accordance with various example implementations. In order to avoid repetition and for better illustration, the methods in FIGS. 13 and 14 will be described with reference to the transistor devices described above. However, the methods in FIGS. 13 and 14 can also be used for producing other transistor devices.

While the methods are described as sequences of processes, it should be noted that the illustrated order of the processes should not be interpreted as restrictive. In particular, different processes can also be carried out simultaneously during the processing and production of transistor devices, for example by different components being implemented in common processes.

The method in FIG. 13 comprises, at 130, providing a transistor chip. As explained, a transistor chip is a chip comprising one or more transistors. The transistor chip can be in particular a transistor chip 20, as illustrated in FIG. 2. The transistor chip can have a first load electrode on a first side and a second load electrode on a second side, as illustrated for the load electrodes 21, 22 from FIG. 5A.

At 131, the method comprises providing a magnetic field sensor chip comprising one or more magnetic field sensors on an electrode of the transistor chip by means of a chip-on-chip technology, as was explained for example for the magnetic field sensor chip 30 from FIG. 3A or the magnetic field sensor chip 60 from FIG. 6. Besides one or more magnetic field sensors, for example vertical Hall sensors, the magnetic field sensor chip can also comprise further functions, such as driver and processing functions for the magnetic field sensor or functions for the transistor of the transistor chip, as was explained on the basis of the examples with reference to FIGS. 9 to 12.

All variations and modifications that were described with regard to the devices in FIGS. 1 and 3A to 12 are also applicable to the methods in FIGS. 13 and 14.

A further method is illustrated in FIG. 14. The method in FIG. 14 comprises, at 140, providing a transistor chip. This corresponds to providing a transistor chip as already described at 130 with reference to FIG. 13. In particular, the transistor chip can have a first load electrode on a first side and a second load electrode on a second side.

At 141, a first magnetic field sensor is provided at a first location on the second load electrode of the transistor chip and, at 142, a second magnetic field sensor is provided at a second location on the second load electrode. In this case, the first and second locations are chosen such that the magnetic field sensors measure different effective magnetic fields in the case of current flow through a transistor of the transistor chip. This can be achieved, as described with reference to FIG. 5B, by the magnetic field lines impinging on the first and second magnetic field sensors at different angles. In some example implementations, moreover, the first magnetic field sensor can be arranged in an interspace between an electrical connection to the load electrode and the load electrode itself, as is shown for the vertical Hall sensor 50A in FIG. 5A and for the vertical Hall sensor 61A in FIG. 7. The second magnetic field sensor is arranged outside the interspace. As already explained, this intensifies the effect that the two magnetic field sensors see different effective magnetic fields and the influence of stray fields can then be reduced by difference formation between the signals.

The methods in FIGS. 13 and 14 can also be combined by the first magnetic field sensor and the second magnetic field sensor being provided in a magnetic field sensor chip, which is then fitted on the electrode by means of a chip-on-chip technology.

In some of the transistor devices and methods described above, a stray field suppression is achieved by measurements of two magnetic field sensors being combined with one another, as was explained in detail for example with reference to FIG. 5B. A further possibility for stray field suppression will now be explained with reference to FIGS. 15-17. This possibility of stray field suppression is combinable with the example implementations discussed above, that is to say that it can be used in any of the example implementations mentioned above.

Figure 15:
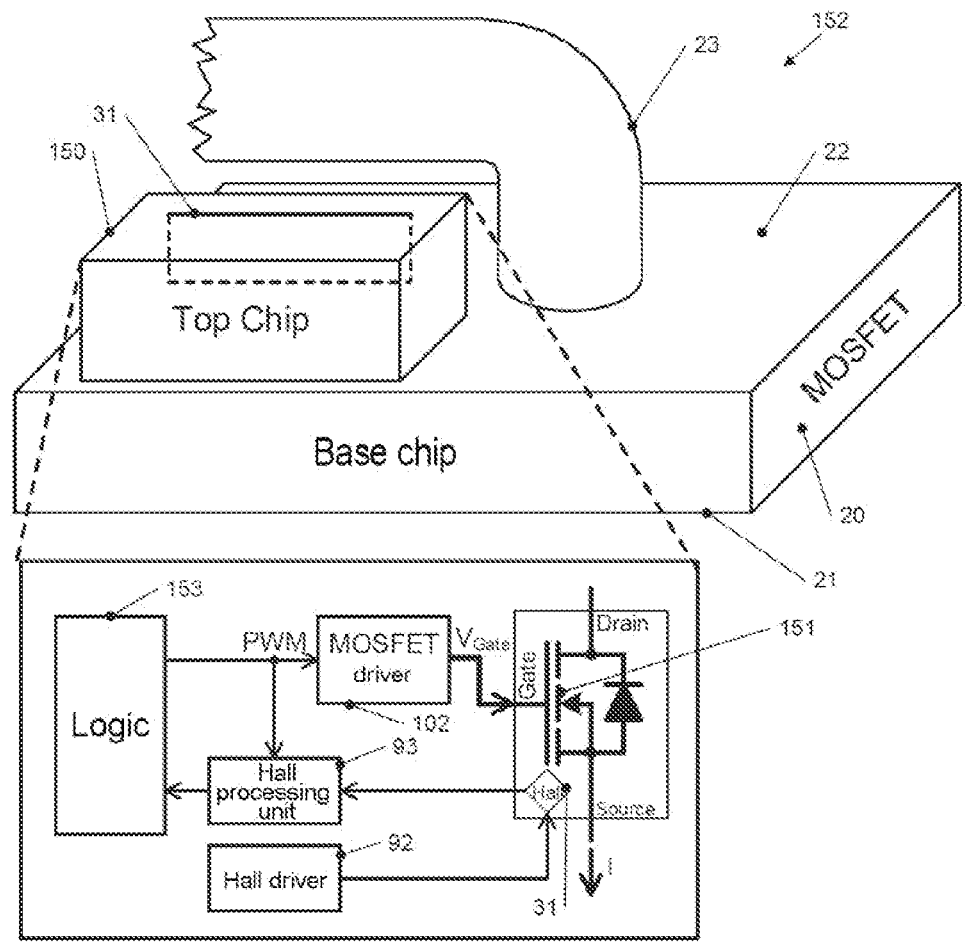
FIG. 15 shows a transistor device in accordance with a further example implementation.

FIG. 15 shows a transistor device 152 in accordance with a further example implementation. In order to avoid repetition, components that have already been explained with reference to previous example implementations bear the same reference signs and will not be explained again. The transistor device 152 in FIG. 15 comprises a magnetic field sensor chip 150, which, as in previous example implementations, is fitted on a transistor chip 20, in particular on an electrode 22 thereof, by means of a chip-on-chip technology. The magnetic field sensor chip 150 comprises a vertical Hall sensor 31 in order to measure a current through the transistor chip 20, as described.

A more detailed diagram of the magnetic field sensor chip 150 is illustrated in the lower part of FIG. 15. Moreover, a MOSFET transistor 151 of the transistor chip 20 is illustrated here for elucidating the exchange of signals. However, the MOSFET transistor 151 is not part of the magnetic field sensor chip 150, but rather is implemented in the transistor chip 20 as described.

In addition to the components already discussed, the magnetic field sensor chip 150 comprises a logic circuit 153, which drives the MOSFET driver circuit 102 with a pulse-width-modulated signal PWM (abbreviation of "pulse width modulation"). Accordingly, the MOSFET driver circuit generates a pulse-width-modulated gate voltage $V_{Gate}$ as control signal for the MOSFET transistor 151. A pulse-width-modulated driving of this type is present anyway in many applications. By way of example, in the case of switched mode power supplies (SMPS), in some implementations a so-called primary-side switch is driven with a pulse-width-modulated signal in order to feed energy to a transformer, wherein in some implementations an output voltage can be regulated by changes in the pulse width.

The Hall sensor 31 is driven by the Hall driver 92, and the Hall signal is evaluated by the Hall processing unit 93. In the example implementation in FIG. 15, the Hall processing unit 93 additionally obtains the pulse-width-modulated signal PWM and measures the magnetic field both when the transistor 151 is switched on (i.e. is conducting between drain and source) and when the transistor is switched off (i.e. is blocking). By means of a difference formation between the magnetic fields, a stray field can then be extracted by the logic circuit 153, which then serves as an evaluation circuit. This will now be explained on the basis of example signals with reference to FIG. 16.

Figure 16:
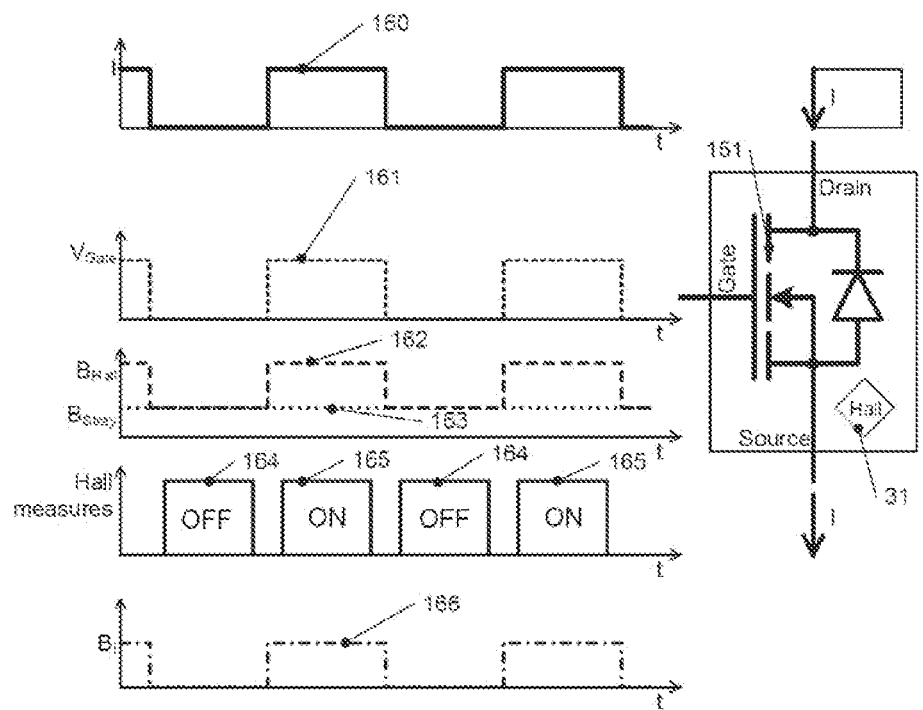
FIG. 16 shows example signals for the transistor device from FIG. 15.

In FIG. 16, a curve 161 shows an example of a pulse-width-modulated gate voltage $V_{Gate}$, which leads to a corresponding pulse-width-modulated current flow of a current I in accordance with a curve 160.

A curve 162 shows a corresponding magnetic field $B_{Hall}$ measured by the Hall sensor 31. Besides a portion generated by the current flow, the measured magnetic field also has a portion of a stray magnetic field $B_{Stray}$ in accordance with a curve 163. The stray magnetic field can in particular also be an inhomogeneous stray magnetic field.

In the example implementation illustrated, magnetic field measurements are carried out both in the switched-off state of the transistor (no current flow through the transistor) and in the switched-on state. This is illustrated by blocks 164, 165. The magnetic field without current flow is measured during the blocks 164, and the magnetic field with current flow is measured during the blocks 165. The measurement values thus obtained are subtracted from one another. By way of example, from the magnetic field measured during a block 165, there is subtracted the magnetic field measured in the previous block 164, the magnetic field measured in the subsequent block 164 or else an average value of the magnetic fields measured in the previous block 164 and in the subsequent block 164. The curve 166 shows the result, which substantially corresponds to the magnetic field caused by the current in accordance with the curve 160 without the stray magnetic field. Deviations from the magnetic field caused by the current can arise for example if the stray magnetic field varies on a timescale which is not long relative to the period duration of the pulse-width-modulated signal. Typical stray magnetic fields vary slowly, however, and can be compensated for in this way.

Figure 17:
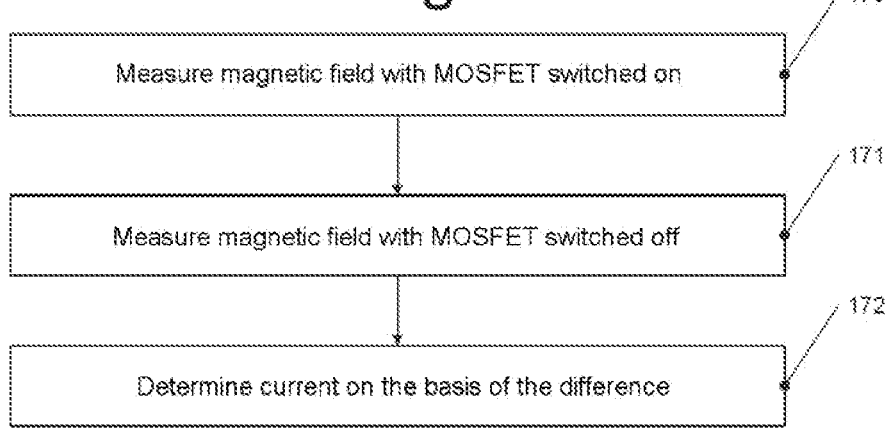
FIG. 17 shows a flow diagram for illustrating a method in accordance with a further example implementation.

FIG. 17 illustrates a corresponding method for measuring a current of a transistor, in particular a MOSFET, which is controlled with a pulse-width-modulated signal.

The method can be implemented by means of the transistor device 152 from FIG. 15 and is described with reference to the previous explanations concerning FIGS. 15 and 16. However, the application of the method in FIG. 17 is not restricted to the transistor device 152 from FIG. 15.

At 170, a magnetic field is measured with a MOSFET or another transistor switched on. At 171, the magnetic field is measured with the transistor switched off. As explained with reference to FIG. 16, this can take place repeatedly while a pulse-width-modulated control signal is applied to the transistor. At 172, a current through the transistor is then determined on the basis of a difference in the measured magnetic fields, as likewise already explained above.

In example implementations of this type, the stray field compensation can thus be carried out at the same time as a pulse-width-modulated driving of the transistor that is present anyway in many applications, with the result that, for example, a separate calibration phase for measuring a background is not necessary.

Although specific example implementations have been illustrated and described in this description, persons who have routine knowledge in the art will recognize that a multiplicity of alternative and/or equivalent implementations can be chosen as substitution for the specific example implementations shown and described in this description, without departing from the scope of the disclosure. The intention is for this application to cover all adaptations or variations of the specific example implementations discussed here. Therefore, the intention is for this disclosure to be restricted only by the claims and the equivalents of the claims.

The invention claimed is:

1. A transistor device, comprising:
  a transistor chip comprising:
    a first load electrode, and
    a second load electrode; and
  a magnetic field sensor chip comprising at least one magnetic field sensor,
    wherein the magnetic field sensor chip is arranged directly on at least one of the first load electrode or the second load electrode, and
    wherein the magnetic field sensor chip includes a vertical Hall sensor.

2. The transistor device of claim 1, further comprising:
  a bond wire contacting one of the first load electrode or the second load electrode.

3. The transistor device of claim 2, wherein the bond wire has a bent shape.

4. The transistor device of claim 2, wherein the at least one magnetic field sensor is arranged to be sensitive to magnetic fields generated by current flow through the bond wire.

5. The transistor device of claim 1, wherein the at least one magnetic field sensor includes the vertical Hall sensor.

6. The transistor device of claim 1, wherein the at least one magnetic field sensor includes a lateral Hall sensor.

7. The transistor device of claim 1, wherein the at least one magnetic field sensor is arranged to be sensitive to magnetic fields perpendicular to a plane of the at least one magnetic field sensor.

8. The transistor device of claim 1, wherein the at least one magnetic field sensor includes the vertical Hall sensor and another vertical Hall sensor.

9. A transistor device, comprising:
  a transistor chip having a first load electrode and a second load electrode,
  a sensor chip comprising:
    a first magnetic field sensor arranged directly on the first load electrode or the second load electrode,
    a second magnetic field sensor arranged directly on the first load electrode or the second load electrode,
      wherein the first magnetic field sensor and the second magnetic field sensor are arranged to measure different magnetic fields when there is a current flow through the transistor device,
    at least one of a first driver circuit or a first processing circuit for the first magnetic field sensor, and
    at least one of a second driver circuit or a second processing circuit for the second magnetic field sensor.

10. The transistor device of claim 9, wherein the first magnetic field sensor and the second magnetic field sensor are arranged in parallel.

11. The transistor device of claim 9, wherein the first magnetic field sensor and the second magnetic field sensor are arranged to have a sensitivity direction perpendicular to a plane of at least one of the first magnetic field sensor or the second magnetic field sensor.

12. The transistor device of claim 9, further comprising:
  an electrical connection,
    wherein one of the first magnetic field sensor or the second magnetic field sensor is arranged between the electrical connection and one of the first load electrode or the second load electrode.

13. The transistor device of claim 12, wherein the electrical connection comprises a bond wire.

14. The transistor device of claim 12, wherein the electrical connection comprises a metal clip.

15. A method for producing a transistor device, comprising:
  providing a transistor chip comprising:
    a first load electrode, and
    a second load electrode; and
  providing a magnetic field sensor chip directly on at least one of the first load electrode or the second load electrode,
    wherein the magnetic field sensor chip comprises at least one magnetic field sensor, and
    wherein the at least one magnetic field sensor includes a vertical Hall sensor.

16. The method of claim 15, further comprising:
  providing a bond wire to contact one of the first load electrode or the second load electrode.

17. The method of claim 16, wherein providing the magnetic field sensor chip comprises:
  arranging the at least one magnetic field sensor to be sensitive to magnetic fields generated by current flow through the bond wire.

18. The method of claim 16, wherein providing the magnetic field sensor chip comprises:
  arranging a magnetic field sensor, of the at least one magnetic field sensor, between the bond wire and one of the first load electrode or the second load electrode.

19. The method of claim 15, wherein providing the magnetic field sensor chip comprises:
  arranging the at least one magnetic field sensor to be sensitive to magnetic fields perpendicular to a plane of the at least one magnetic field sensor.

20. The method of claim 15, wherein providing the magnetic field sensor chip comprises:
  arranging a first magnetic field sensor and a second magnetic field sensor, of the at least one magnetic field sensor, to be in parallel.

* * * * *